(12) United States Patent
Ozkeskin (10) Patent No.: US 9,958,855 B2
(45) Date of Patent: May 1, 2018

(54) ELECTRO DISCHARGE MACHINING SYSTEM WITH BATCH PROCESSING OF HOLES AND MANUFACTURING METHOD THEREFOR

(71) Applicant: Applied Materials, Inc., Santa Clara, CA (US)

(72) Inventor: Fatih Mert Ozkeskin, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 265 days.

(21) Appl. No.: 14/438,219

(22) PCT Filed: Oct. 25, 2013

(86) PCT No.: PCT/US2013/066983
§ 371 (c)(1),
(2) Date: Apr. 23, 2015

(87) PCT Pub. No.: WO2014/066865
PCT Pub. Date: May 1, 2014

(65) Prior Publication Data
US 2015/0293521 A1    Oct. 15, 2015

Related U.S. Application Data

(60) Provisional application No. 61/718,695, filed on Oct. 25, 2012.

(51) Int. Cl.
*B23H 1/02* (2006.01)
*G05B 19/402* (2006.01)
(Continued)

(52) U.S. Cl.
CPC ............ *G05B 19/402* (2013.01); *B23H 1/028* (2013.01); *B23H 7/265* (2013.01); *B23H 9/00* (2013.01);
(Continued)

(58) Field of Classification Search
CPC .......... B23H 1/00; B23H 1/022; B23H 1/024; B23H 1/028; B23H 3/04; B23H 5/02; B23H 7/265; B23H 9/00; G05B 19/402
(Continued)

(56) References Cited

U.S. PATENT DOCUMENTS 5,051,554 A    9/1991   Tsukamoto
6,310,312 B1  10/2001  Higuerey et al.
(Continued)

FOREIGN PATENT DOCUMENTS

JP    10263935 A    10/1998

OTHER PUBLICATIONS

PCT International Search Report and Written Opinion in PCT/US2013/088983 dated Feb. 17, 2014, 9 pages.
PCT International Preliminary Report on Patentability in PCT/US2013/066983 dated Apr. 28, 2015, 7 pages.
U.S. Appl. No. 14/438,221, filed Apr. 24, 2015, Fatih Mert Ozkeskin.

*Primary Examiner* — Brian Jennison
(74) *Attorney, Agent, or Firm* — Servilla Whitney LLC (57) ABSTRACT

An electro discharge machining system, and manufacturing method therefor, including: providing an electro discharge machining unit and control; providing a workpiece holder; providing a tool holder for a tool having an electrode array; and operatively connecting the workpiece holder and the tool holder to the electro discharge machining unit and control for batch electro-discharge machining of a workpiece to a configuration compatible with the electrode array.

19 Claims, 5 Drawing Sheets

(51) Int. Cl.
  *B23H 9/00* (2006.01)
  *B23H 7/26* (2006.01)
  *H01L 21/768* (2006.01)
  *H01L 23/48* (2006.01)
  *H01L 21/306* (2006.01)
  *G05B 19/404* (2006.01)
  *B23H 5/02* (2006.01)

(52) U.S. Cl.
  CPC ...... *G05B 19/404* (2013.01); *H01L 21/30608* (2013.01); *H01L 21/76898* (2013.01); *H01L 23/481* (2013.01); *B23H 5/02* (2013.01); *G05B 2219/37032* (2013.01); *G05B 2219/37435* (2013.01); *H01L 2924/0002* (2013.01)

(58) Field of Classification Search
  USPC ...................................................... 219/69.11
  See application file for complete search history.

(56) References Cited

U.S. PATENT DOCUMENTS

| | | | |
|---|---|---|---|
| 6,586,699 B1 | 7/2003 | Gianchandani et al. | |
| 2002/0117478 A1 | 8/2002 | Yamada et al. | |
| 2002/0179573 A1* | 12/2002 | Gianchandani | B23H 1/00 219/69.11 |
| 2007/0167826 A1* | 7/2007 | Lee | A61B 8/12 600/463 |
| 2010/0140226 A1 | 6/2010 | Sheu | |
| 2010/0243612 A1* | 9/2010 | Leao | B23H 1/028 219/69.17 |
| 2012/0055912 A1* | 3/2012 | Sheu | B23H 9/18 219/201 |

\* cited by examiner

ELECTRO DISCHARGE MACHINING SYSTEM WITH BATCH PROCESSING OF HOLES AND MANUFACTURING METHOD THEREFOR

CROSS-REFERENCE TO RELATED APPLICATION(S)

This application claims the benefit of U.S. Provisional Patent Application Ser. No. 61/718,695 filed Oct. 25, 2012, and the subject matter thereof is incorporated herein by reference thereto.

The present application contains subject matter related to a concurrently filed U.S. Patent Application by Fatih Merten Ozkeskin, titled "ELECTRO DISCHARGE MACHINING SYSTEM AND METHOD OF OPERATION THEREOF". The related application is assigned to Applied Materials, Inc. and is identified by U.S. Patent Application Publication No. 20150273600A1. The subject matter thereof is incorporated herein by reference thereto.

TECHNICAL FIELD

The present invention relates generally to an electro discharge machining system and more particularly to a system for batch processing of holes in an electro discharge machining system.

BACKGROUND

The rapidly growing market for portable electronic devices, e.g. cellular phones, laptop computers, and tablet computers, is an integral facet of modern life. The multitude of portable devices represents one of the largest potential market opportunities for next generation manufacturing. These devices have unique attributes that have significant impacts on manufacturing integration, in that they must be generally small, lightweight, and rich in functionality and they must be produced in high volumes at relatively low cost.

As an extension of the semiconductor industry, the electronics manufacturing industry has witnessed ever-increasing commercial competitive pressures, along with growing consumer expectations and the diminishing opportunities for meaningful product differentiation in the marketplace.

Manufacturing, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced manufacturing requirements of microprocessors and portable electronics with successive generations of semiconductors. Many industry road maps have identified significant gaps between the current semiconductor capability and the available supporting electronic manufacturing technologies. The limitations and issues with current technologies include increasing clock rates, electromagnetic interference, thermal loads, second level assembly reliability stresses and cost.

As these manufacturing systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust methods for manufacture. Solutions to these problems have been long sought but prior developments have not taught or suggested any solutions and, thus, solutions to these problems have long eluded those skilled in the art.

SUMMARY

The present invention provides a method of manufacturing an electro discharge machining system including: providing an electro discharge machining unit and control; providing a workpiece holder; providing a tool holder for a tool having an electrode array; and operatively connecting the workpiece holder and the tool holder to the electro discharge machining unit and control for batch electro-discharge machining of a workpiece to a configuration compatible with the electrode array.

The present invention provides an electro discharge machining system including: an electro discharge machining unit and control; a workpiece holder; providing a tool holder for a tool having an electrode array; and wherein the workpiece holder and the tool holder are operatively connected to the electro discharge machining unit and control for batch electro-discharge machining of a workpiece to a configuration compatible with the electrode array.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagramatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane of a top surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material. The term "processing" as used herein includes deposition of material or photoresist, patterning, exposure, development, etching, cleaning, and/or removal of the material or photoresist as used in forming a described structure.

Figure 1:
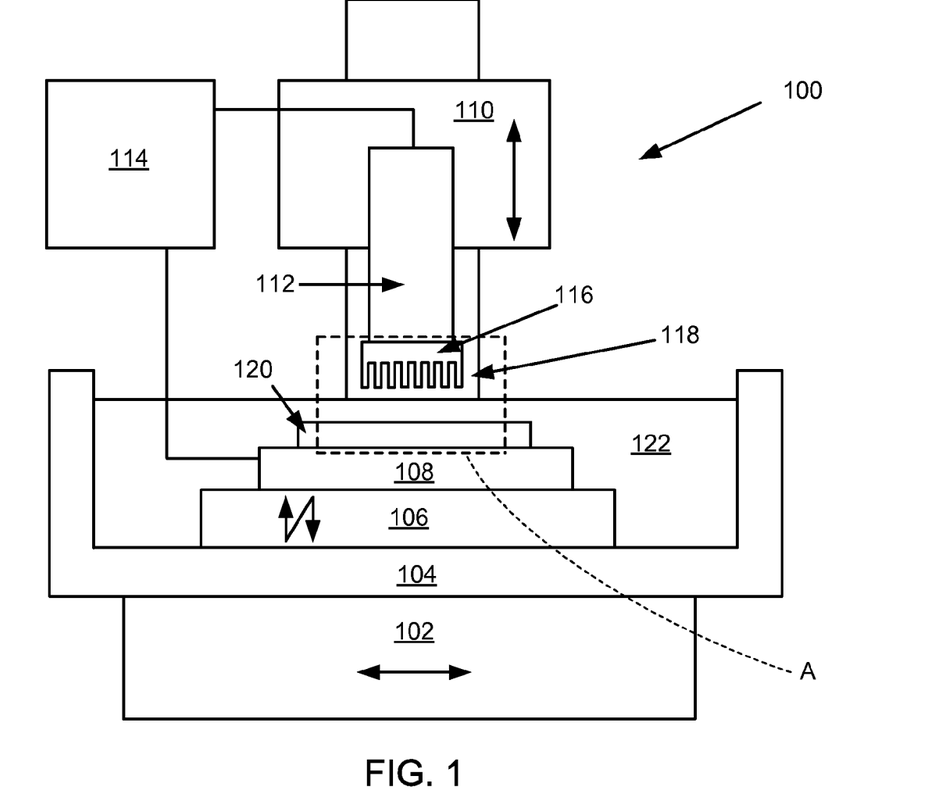
FIG. 1 is a cross-sectional view of an electro discharge machining system in an embodiment of the present invention.

Referring now to FIG. 1, therein is shown a cross-sectional view of an electro discharge machining system 100 in an embodiment of the present invention. One embodiment of the present invention uses micro-electro discharge machining (Micro-EDM), which is a heat driven disruptive technology for nano-scale selective material removal.

The electro discharge machining system 100 has an X-Y stage 102 for moving a container 104 in X and Y directions. The X-Y stage 102 provides X-Y motion up to approximately 500 mm in length and 10 nm in resolution. The Z stage 110 provides Z motion approximately 150 mm in 1 nm resolution.

The container 104 supports a vibrator 106 capable of imposing small X, Y, and/or Z motions on a workpiece holder 108. In one embodiment, the small vibrations are in the X-Y directions and are around <1 nm to facilitate particle escape from the machining zone.

Supported above the workpiece holder 108 is a Z stage 110 for moving a tool holder 112 in the Z direction.

A Micro-EDM unit and control 114 is connected between the workpiece holder 108 and the tool holder 112 to electrically connect to a workpiece 120 and to a tool 116, respectively. The workpiece holder 108 is designed for easy and rapid replacement of the tool 116.

As shown, the tool 116 is sized smaller than the work piece 120 in which the stage is moved in X and Y directions to position the work piece under the tool.

In other embodiments, the tool may be mounted on an X-Y stage to position the tool over the work piece.

In other embodiments, the tool 116 may be of similar size of the work piece obviating the need for an X-Y stage.

In other embodiments, multiple tools 116 may be mounted to the tool holder 112.

In other embodiments, the stage 102 may provide the Z-motion.

To increase the throughput of the system 100, the system 100 includes a spare tool that is quickly exchanged by the tool holder 112 to replace worn out tools.

In other embodiments, the system 100 may include an additional post-clean station which cleans and/or removes particles created from the work piece created from the micro-EDM process.

The electro discharge machining system 100 is shown having the tool 116 with at least one electrode array 118 that can be a cathode brought into very close proximity, 1 nm to 100 nm, with the workpiece 120.

The workpiece 120 can be an anode submerged in a fluid 122 held by the container 104. The fluid 122 can be a dielectric fluid or a non-dielectric chemical fluid. For example, the chemical fluid can be utilized for an electrochemically assisted discharge machining using $NaNO_3$ or similar chemicals. A spark discharge occurs in the fluid 122 between the electrode array 118 of the tool 116 and the workpiece 120 and thermally erodes the workpiece 120.

The electro discharge machining system 100 can be utilized for Through-Silicon Vias (TSVs) where the workpiece 120, such as heavily doped silicon, is patterned in the shape of repeated through holes or blind holes using the tool 116 specially made for TSVs. The workpiece 120 should include a conductive surface and can be below ten ohms centimeter. The purpose of the tool 116 is to create TSVs with a high aspect ratio.

It has been discovered that utilizing the electro discharge machining system 100 having the tool 116 to work on the workpiece 120 forming the TSVs, eliminates the need for masks and patterning of the workpiece 120, and provides an inexpensive and reliable process for creating features with sizes down to few microns (<5) in a variety of devices. This novel technology provides potential and cheap solution for TSVs or for blind via applications for 3D, 2.5D interposers, and other applications.

It has been further discovered that the electro discharge machining system 100 can increase throughput using the chemical fluid instead of the dielectric fluid.

It has been further discovered that utilizing the electro discharge machining system 100 can reduce costs and increase throughput when utilized to create the TSVs in a batch with high aspect ratios (>10) by removing lithography process steps as well as deep reactive ion etch steps.

Figure 2:
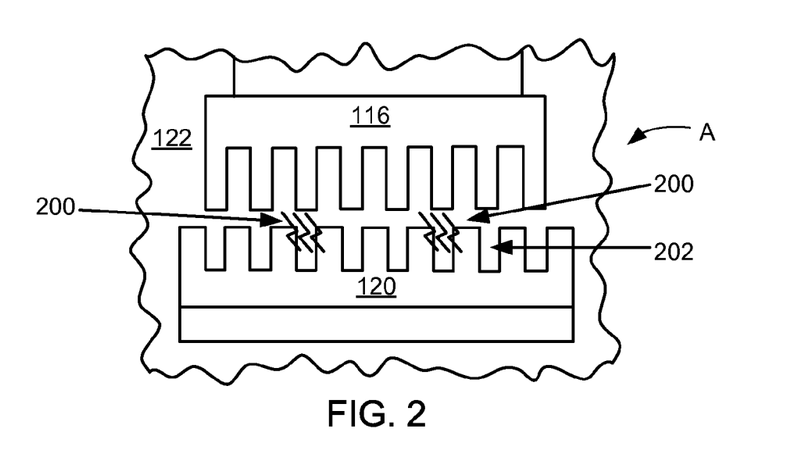
FIG. 2 is a magnified view of section A of the electro discharge machining system of FIG. 1.

Referring now to FIG. 2, therein is shown a magnified view of section A of the electro discharge machining system 100 of FIG. 1. The electro discharge machining system 100 is shown with having the tool 116 brought in close proximity with the workpiece 120. The fluid 122 is shown between the tool 116 and the workpiece 120.

Spark discharges 200 are shown through the fluid 122 and between the tool 116 and the workpiece 120 removing material from the workpiece 120 in the process. The tool 116 can be utilized to create TSVs 202 simultaneously as a batch of TSVs. This batch-mode Micro-EDM is a technique where the tool 116 is lithographically fabricated and used repeatedly to fabricate repeated uniform patterns and arrays in the workpiece 120. The electro discharge machining system 100 can be used to fabricate the TSVs 202 as high aspect ratio through vias or high aspect ratio blind vias on the workpiece 120. The electro discharge machining system 100 enables application of such technology to fabricate the TSVs 202.

Figure 3:
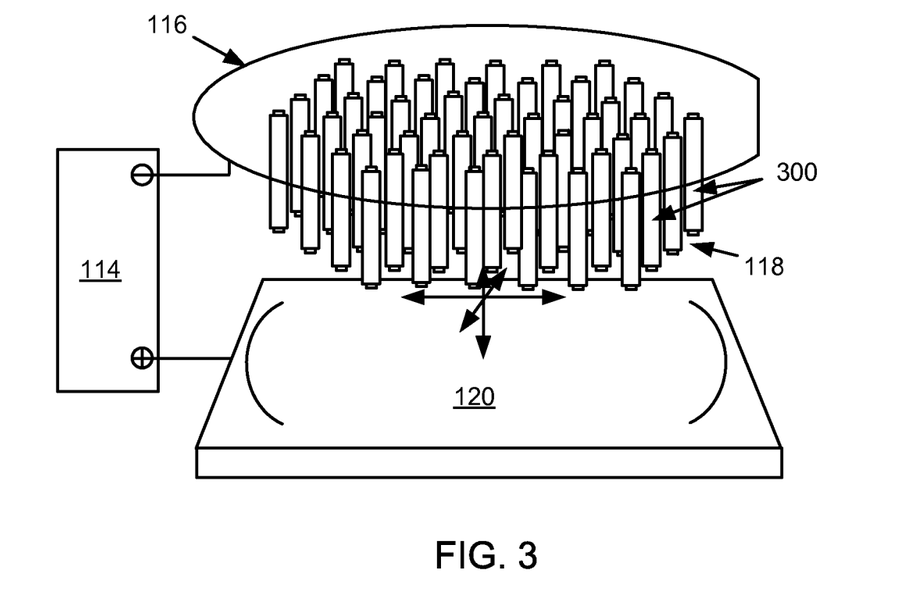
FIG. 3 is an isometric view of a portion of the tool positioned over the workpiece in an embodiment of the present invention.

Referring now to FIG. 3, therein is shown an isometric view of a portion of the tool 116 with a number of parallel electrodes 300 forming the electrode array 118, positioned over the workpiece 120 in an embodiment of the present invention. The Micro-EDM unit and control 114 is shown electrically connected biasing and providing electro static discharges in pulses between the tool 116 and the workpiece 120.

Figure 4:
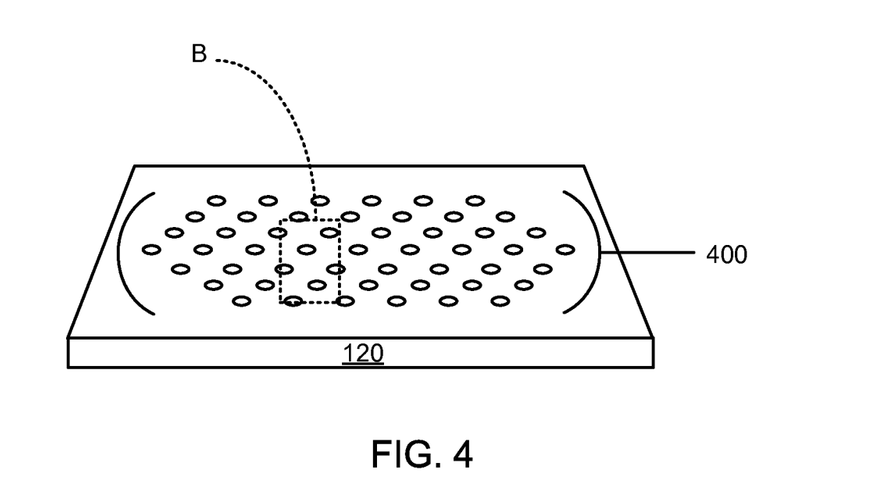
FIG. 4 is an isometric view of the workpiece of FIG. 3 after a machining phase of manufacture.

Referring now to FIG. 4, therein is shown an isometric view of the workpiece 120 of FIG. 3 after a machining phase of manufacture. The workpiece 120 can be shown having batched TSVs 400.

Figure 5:
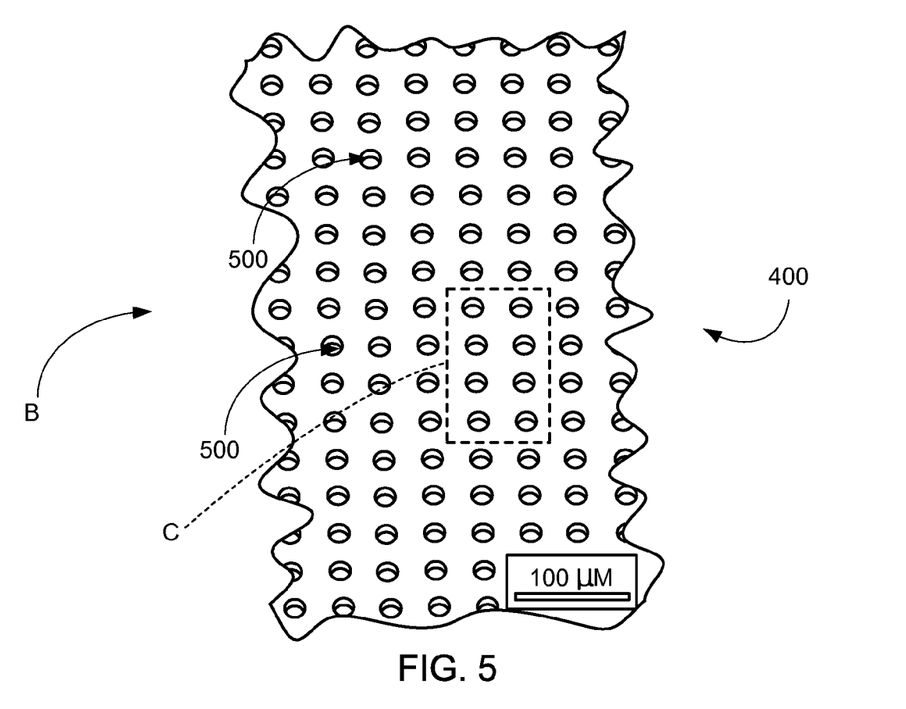
FIG. 5 is a magnified view of section B of the workpiece of FIG. 4.

Referring now to FIG. 5, therein is shown a magnified view of section B of the workpiece 120 of FIG. 4. The through holes 500 that make up the batched TSVs 400 are shown in the workpiece 120. The workpiece 120 in the present example can be 50 μm thick stainless steel but can be much thicker up to 1 mm.

Figure 6:
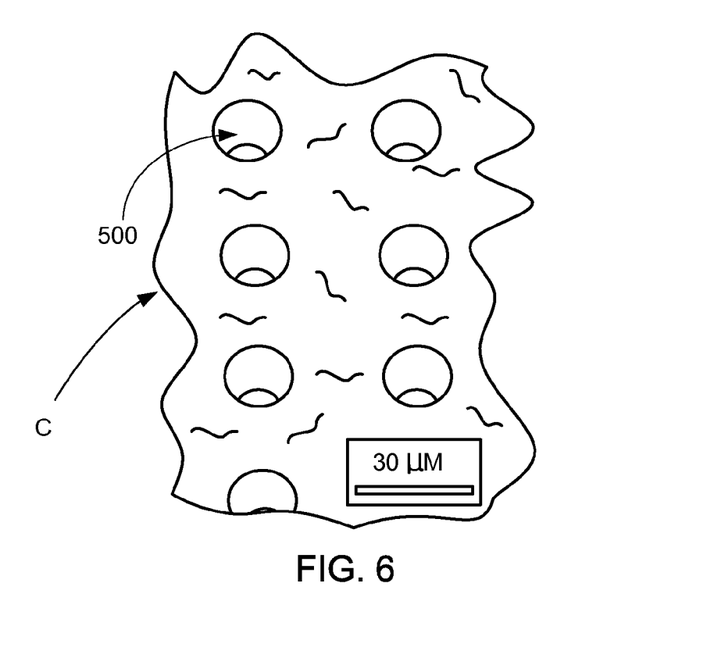
FIG. 6 is a magnified view of section C of the workpiece of FIG. 5.

Referring now to FIG. 6, therein is shown a magnified view of section C of the workpiece 120 of FIG. 5 showing the fine feature size of the through holes 500.

Figure 7:
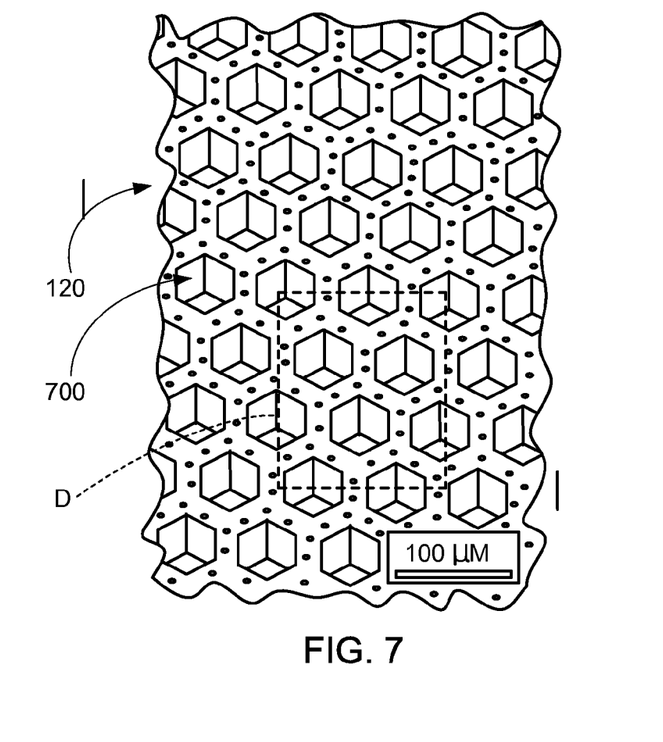
FIG. 7 is an isometric view of a workpiece after a machining phase of manufacture in a further embodiment of the present invention.

Referring now to FIG. 7, therein is shown an isometric view of a workpiece 120 after a machining phase of manufacture in a further embodiment of the present invention. The workpiece 120 can be shown having honey comb structures 700 formed therein with the electro discharge machining system 100. By control of the vibrator 106 of FIG. 1, holes of different shapes or configurations may be machined in the workpiece 120. The workpiece 120 in this example can be 125 μm thick graphite.

Figure 8:
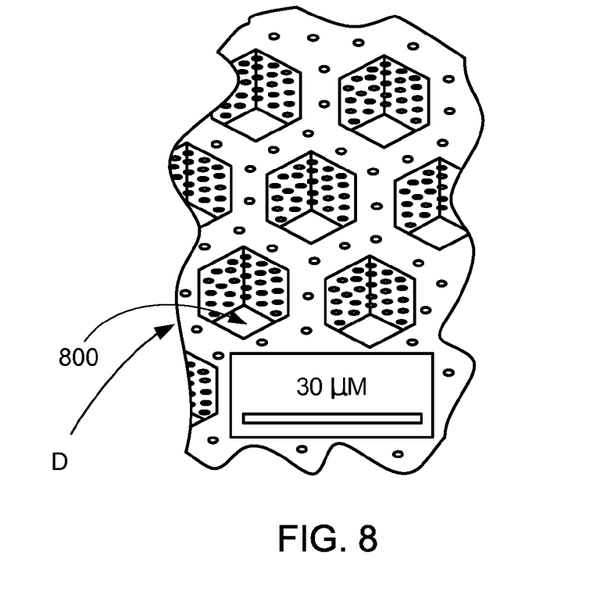
FIG. 8 is a magnified view of section D of the workpiece of FIG. 7 showing a honey comb hole.

Referring now to FIG. 8, therein is shown a magnified view of section D of the workpiece 120 of FIG. 7 showing a honey comb hole 800.

Figure 9:
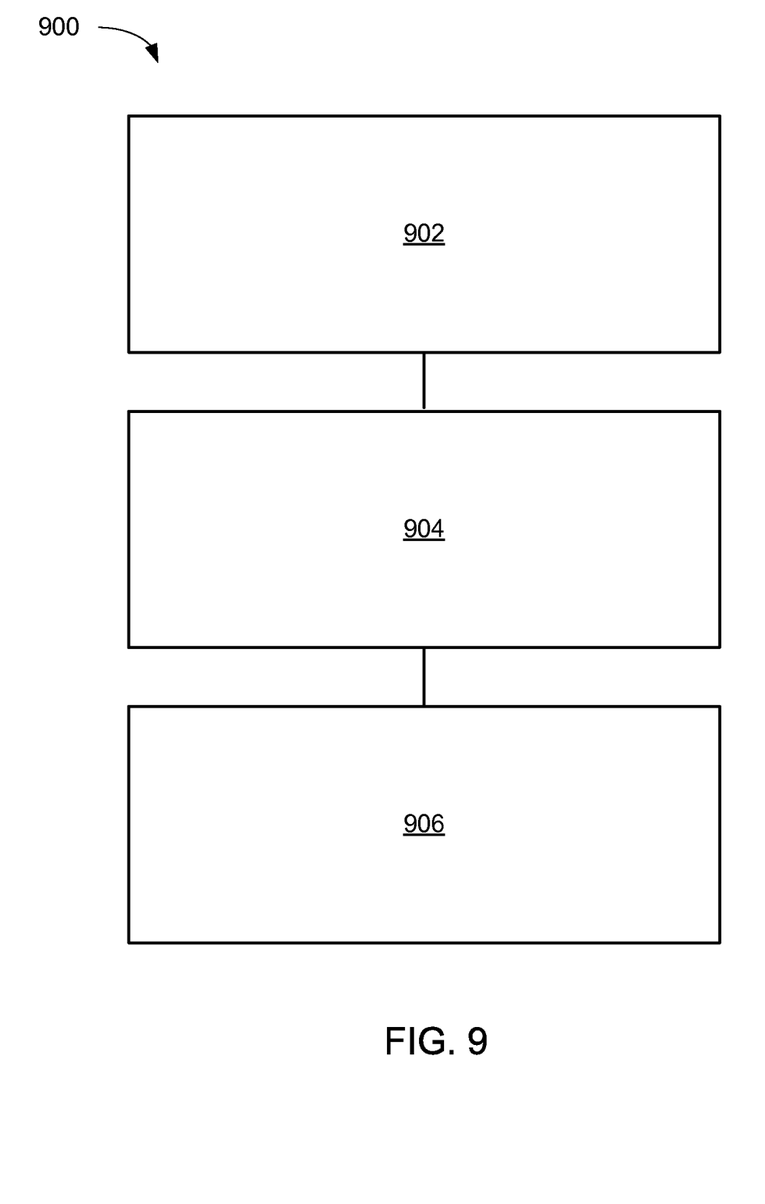
FIG. 9 is a flow chart of a method of manufacture of the electro discharge machining system in a further embodiment of the present invention.

Referring now to FIG. 9, therein is shown a flow chart of a method 900 of manufacturing an electro discharge machining system 100 including: providing an electro discharge machining unit and control in a block 902; providing a workpiece holder; providing a tool holder for a tool having an electrode array in a block 904; and operatively connecting the workpiece holder and the tool holder to the electro discharge machining unit and control for electro-discharge machining of a workpiece to a configuration compatible with the electrode array in a block 906.

Thus, it has been discovered that the electro discharge machining system 100 and batch machining of vias of the present invention furnishes important and heretofore unknown and unavailable solutions, capabilities, and functional aspects for electro discharge machining system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operating an electro discharge machining system comprising:
    providing an electro discharge machining unit and control;
    providing a workpiece holder;
    providing a tool holder holding a tool having an electrode array, the tool specially made to form through silicon vias;
    providing a container containing non-dielectric fluid to submerge the workpiece and the tool in the non-dielectric fluid; and
    operatively connecting the workpiece holder and the tool holder to the electro discharge machining unit and control and batch electro-discharge machining an array of through holes in a silicon workpiece.

2. The method as claimed in claim 1 further comprising providing a vibrator and vibrating the workpiece and the tool relative to each other and electro discharge machining a different configuration via in the workpiece from a configuration of the electrode array.

3. The method as claimed in claim 1, wherein the non-dielectric fluid comprises a chemical fluid comprising $NaNO_3$.

4. The method as claimed in claim 1 further comprising providing the tool and producing a via in the workpiece having an aspect ratio greater than 10.

5. The method as claimed in claim 1 further comprising providing stages for the workpiece holder and the tool holder and moving the workpiece and the tool relative to each other to electro discharge machine silicon.

6. An electro discharge machining system comprising:
    an electro discharge machining unit and control;
    a workpiece holder;
    a tool holder holding a tool having an electrode array, the tool specially made to form through silicon vias;
    a container containing non-dielectric fluid to submerge the workpiece and the tool in the non-dielectric fluid; and
    wherein the workpiece holder and the tool holder are operatively connected to the electro discharge machining unit and control to batch electro-discharge machine an array of through holes in a silicon workpiece.

7. The system as claimed in claim 6 further comprising a vibrator to vibrate the workpiece and the tool relative to each other to electro discharge machine a different configuration via in the workpiece from a configuration of the electrode array.

8. The system as claimed in claim 6, wherein the non-dielectric fluid comprises a chemical fluid comprising $NaNO_3$.

9. The system as claimed in claim 6 further comprising the tool to produce a via in a workpiece having an aspect ratio greater than 10.

10. The system as claimed in claim 6 further comprising stages for the workpiece holder and the tool holder to move the workpiece and the tool relative to each other to electro discharge machine of silicon.

11. A method of operating an electro discharge machining system comprising:
   providing a micro electro discharge machining unit and control to provide and control an electro discharge;
   providing a workpiece holder to hold a workpiece;
   providing a tool holder holding a tool having an electrode array including a plurality of parallel electrodes, the tool specially made to form through silicon vias;
   providing a container containing non-dielectric chemical fluid to submerge the workpiece and the tool in the non-dielectric chemical fluid; and
   operatively connecting the workpiece holder and the tool holder to the electro discharge machining unit and control and batch electro-discharge machining an array of through holes in a silicon workpiece.

12. The method as claimed in claim 11 further comprising providing a vibrator and vibrating the workpiece and the tool relative to each other under 1 nm and electro discharge machining a different configuration via in the workpiece from a configuration of the electrode array.

13. The method as claimed in claim 11, wherein the non-dielectric chemical fluid comprising $NaNO_3$.

14. The method as claimed in claim 11 further comprising providing the tool and producing a via in the workpiece having an aspect ratio greater than 10 and a feature size below 5 microns.

15. The method as claimed in claim 11 further comprising providing an X-Y stage for the workpiece holder and moving a container for the silicon workpiece and a Z stage for the tool holder and moving the tool and the workpiece relative to each other for electro discharge machining to form blind or through silicon vias.

16. The system as claimed in claim 6 wherein the electrode array includes a plurality of parallel electrodes to batch electro discharge machine the workpiece.

17. The system as claimed in claim 16 further comprising a vibrator to vibrating the workpiece and the tool relative to each other under 1 nm to electro discharge machine a different configuration via in the workpiece from a configuration of the electrode array.

18. The system as claimed in claim 16 further comprising the tool to produce a via in the workpiece having an aspect ratio greater than 10 and a feature size below 5 microns.

19. The system as claimed in claim 16 further comprising an X-Y stage for the workpiece holder to move the container for the silicon workpiece and a Z stage for the tool holder to move the tool and the workpiece relative to each other to electro discharge machine to form blind or through silicon vias.

* * * * *

UNITED STATES PATENT AND TRADEMARK OFFICE
CERTIFICATE OF CORRECTION

PATENT NO. : 9,958,855 B2
APPLICATION NO. : 14/438219
DATED : May 1, 2018
INVENTOR(S) : Faith Mert Ozkeskin

Page 1 of 1

It is certified that error appears in the above-identified patent and that said Letters Patent is hereby corrected as shown below:

On the Title Page

Item (56), Column 2, under "References Cited – Other Publications", Line 2, replace "US2013/088983" with "US2013/066983".

Signed and Sealed this
Twenty-eighth Day of May, 2019

Andrei Iancu
*Director of the United States Patent and Trademark Office*